US012635202B2

(12) United States Patent
Rascuna et al.

(10) Patent No.: US 12,635,202 B2
(45) Date of Patent: May 19, 2026

(54) FRONT SIDE OHMIC CONTACT FORMATION FOR SiC DEVICE

(71) Applicant: STMicroelectronics International N.V., Geneva (CH)

(72) Inventors: Simone Rascuna, Catania (IT); Paolo Badala, Acireale (IT); Gabriele Bellocchi, Catania (IT); Valeria Puglisi, Catania (IT); Dario Tenaglia, Gravina di Catania (IT)

(73) Assignee: STMicroelectronics International N.V., Geneva (CH)

( * ) Notice: Subject to any disclaimer, the term of this patent is extended or adjusted under 35 U.S.C. 154(b) by 351 days.

(21) Appl. No.: 18/341,147

(22) Filed: Jun. 26, 2023

(65) Prior Publication Data

US 2024/0429286 A1    Dec. 26, 2024

(51) Int. Cl.
| | |
|---|---|
| *H10D 62/832* | (2025.01) |
| *H10D 64/01* | (2025.01) |
| *H10D 64/62* | (2025.01) |
| *H10D 64/64* | (2025.01) |

(52) U.S. Cl.
CPC ......... *H10D 62/8325* (2025.01); *H10D 64/01* (2025.01); *H10D 64/62* (2025.01); *H10D 64/64* (2025.01)

(58) Field of Classification Search
CPC ........ H10D 64/01; H10D 64/62; H10D 64/64; H10D 64/23; H10D 62/8325; H10D 8/051; H10D 8/60; H01L 21/0495; H01L 21/0485; H01L 21/283
See application file for complete search history.

(56) References Cited

U.S. PATENT DOCUMENTS

| | | | |
|---|---|---|---|
| 6,034,001 | A | 3/2000 | Shor et al. |
| 10,840,385 | B1 | 11/2020 | Sundaresan et al. |
| 2007/0066039 | A1 | 3/2007 | Agarwal et al. |

(Continued)

FOREIGN PATENT DOCUMENTS

| | | |
|---|---|---|
| CN | 109755110 A | 3/2000 |
| WO | WO 2022/047349 A2 | 3/2022 |

OTHER PUBLICATIONS

Extended European Search Report for Application No. 24180124.0, dated Nov. 26, 2024, 6 pages.

(Continued)

*Primary Examiner* — Wasiul Haider
(74) *Attorney, Agent, or Firm* — Alston & Bird LLP

(57) ABSTRACT

Various embodiments of the present disclosure disclose improved silicon carbide (SiC) power devices and methods of fabrication of such devices. A SiC power device includes a semiconductor base material with a first side and a second side and a first metallic layer disposed on the first side of the semiconductor base material that forms ohmic contacts and Schottky contacts. The SiC power device may be fabricated by forming a first metallic layer on a first side of a semiconductor base material to form a Schottky contact, forming a second metallic layer over the first metallic layer to form a reflective barrier covering the Schottky contact, removing one or more portions of the second metallic layer to expose a first portion of the first metallic layer, and forming silicide portions on the first metallic layer to form ohmic contacts within the Schottky contact.

15 Claims, 8 Drawing Sheets

(56)             References Cited

U.S. PATENT DOCUMENTS

| | | |
|---|---|---|
| 2008/0258183 A1 | 10/2008 | Rupp et al. |
| 2016/0056041 A1* | 2/2016 | Tamaso .............. H10D 62/8325 |
| | | 438/602 |
| 2018/0158914 A1* | 6/2018 | Kitamura .......... H01L 21/02634 |
| 2020/0013723 A1 | 1/2020 | Fuergut et al. |
| 2020/0381254 A1 | 12/2020 | Hilsenbeck |
| 2021/0280424 A1 | 9/2021 | Rascuna' et al. |
| 2021/0328025 A1 | 10/2021 | Ohse et al. |

OTHER PUBLICATIONS

Chen Wu, et al.; Formation Mechanism, Interface Characteristics and the Application of Metal/SIC Thin-Film OHMIC Contact After High-Temperature Treatment; Journal of Materials Research and Technology; vol. 24, May Jun. 2023, pp. 2428-2441.

* cited by examiner

400

FRONT SIDE OHMIC CONTACT FORMATION FOR SiC DEVICE

TECHNOLOGICAL FIELD

Example embodiments of the present disclosure relate generally to the field of silicon carbide (SiC) power devices, and in particular, to front side ohmic contact formations for SiC power devices.

BACKGROUND

Applicant has identified many technical challenges and difficulties associated with SiC devices, such as the SiC power devices. Through applied effort, ingenuity, and innovation, Applicant has solved problems related to the fabrication of SiC power devices by developing solutions embodied in the present disclosure, which are described in detail below.

BRIEF SUMMARY

Various embodiments described herein relate to systems, apparatuses, products, and methods for the fabrication and use of SiC power devices.

In some embodiments, a method includes providing a semiconductor base material comprising a first side and a second side, wherein the semiconductor base material comprises a silicon carbide (SiC) material; forming a first metallic layer on a first side of the semiconductor base material to form a Schottky contact; forming a second metallic layer over the first metallic layer to form a reflective barrier layer covering the Schottky contact; removing one or more portions of the second metallic layer to expose a first portion of the first metallic layer; and forming, through a laser annealing process, one or more silicide portions on the first metallic layer to form one or more ohmic contacts within the Schottky contact.

In some embodiments, the first metallic layer forms the one or more ohmic contacts and the Schottky contact within a p+ region.

In some embodiments, the method further includes, subsequent to forming the one or more silicide portions on the first metallic layer, forming a dielectric layer on the first side of the semiconductor base material. The dielectric layer may cover the semiconductor base material, the first metallic layer, and the second metallic layer.

In some embodiments, the method includes placing a dielectric layer mask over one or more peripheral dielectric portions of the dielectric layer; etching an interior dielectric portion from the dielectric layer to expose the second metallic layer and the one or more silicide portions on the first metallic layer; and removing the dielectric layer mask.

In some embodiments, the method includes forming a frontside metallic layer over the first side of the semiconductor base material, the dielectric layer, the first metallic layer, and the second metallic layer; placing a frontside metallic layer mask over an interior portion of the frontside metallic layer; etching a peripheral frontside metallic portion from the frontside metallic layer to expose the dielectric layer; and removing the frontside metallic layer mask.

In some embodiments, the method includes forming a passivation layer over the dielectric layer and the frontside metallic layer; placing a passivation layer mask over a peripheral portion of the passivation layer; etching an interior passivation layer portion from the passivation layer to expose the frontside metallic layer; and removing the passivation layer mask.

In some embodiments, removing the one or more portions of the second metallic layer includes placing a patterned mask over the second metallic layer. The patterned mask may expose the one or more portions of the second metallic layer. The method may include etching the second metallic layer, through the patterned mask, to remove the one or more portions of the second metallic layer; and removing the patterned mask.

In some embodiments, the method includes, subsequent to forming the one or more silicide portions on the first metallic layer, removing one or more peripheral portions of the first metallic layer and the second metallic layer to expose at least a portion of the semiconductor base material.

In some embodiments, removing the one or more peripheral portions of the first metallic layer includes placing an interior mask over the second metallic layer, wherein the interior mask exposes the one or more peripheral portions of the second metallic layer; etching the second metallic layer and the first metallic layer, around the interior mask, to remove the one or more peripheral portions of the second metallic layer and the first metallic layer; and removing the interior mask.

In some embodiments, the semiconductor base material includes one or more anode implants and the one or more silicide portions on the first metallic layer correspond to the one or more anode implants.

In some embodiments, the method includes forming the one or more anode implants within the first side of the semiconductor base material.

In some embodiments, the first side of the semiconductor base material includes an epitaxial drift layer and the second side of the semiconductor base material includes a doped SiC substrate.

In some embodiments, the method includes forming a backside ohmic contact on the second side of the semiconductor base material; and forming a backside metallic layer over the backside ohmic contact.

In some embodiments, the first metallic layer includes a nickel-based material.

In some embodiments, the second metallic layer includes an aluminum-based material.

In some embodiments, a silicon carbide (SiC) power device includes a semiconductor base material with a first side and a second side; a first metallic layer disposed on the first side of the semiconductor base material, wherein a first portion of the first metallic layer forms one or more ohmic contacts and a second portion of the first metallic layer forms a Schottky contact; and a second metallic layer disposed on the second portion of the first metallic layer.

In some embodiments, the first side of the semiconductor base material includes an epitaxial drift layer.

In some embodiments, the second side of the semiconductor base material includes a doped SiC substrate.

In some embodiments, the first metallic layer includes a nickel material.

In some embodiments, the second metallic layer includes an aluminum material.

The above summary is provided merely for purposes of summarizing some example embodiments to provide a basic understanding of some aspects of the disclosure. Accordingly, it will be appreciated that the above-described embodiments are merely examples and should not be construed to narrow the scope or spirit of the disclosure in any way. It will also be appreciated that the scope of the disclosure encompasses many potential embodiments in addition to those here summarized, some of which will be further described below.

BRIEF SUMMARY OF THE DRAWINGS

Figure 1:
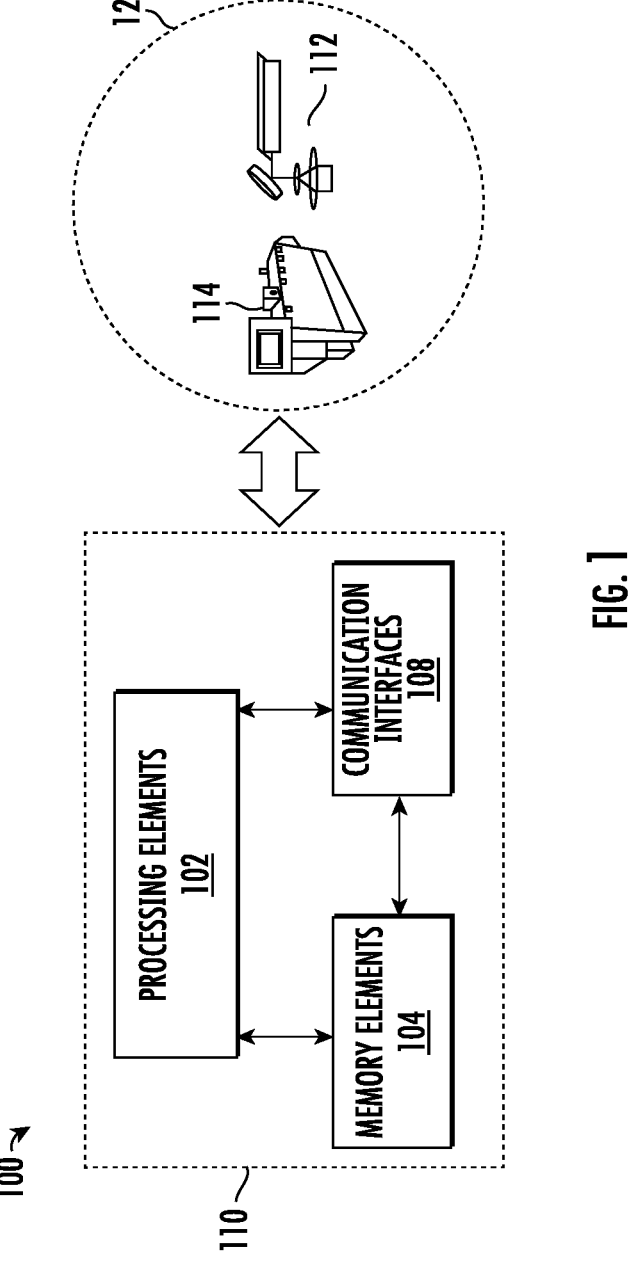
Figure 2A:
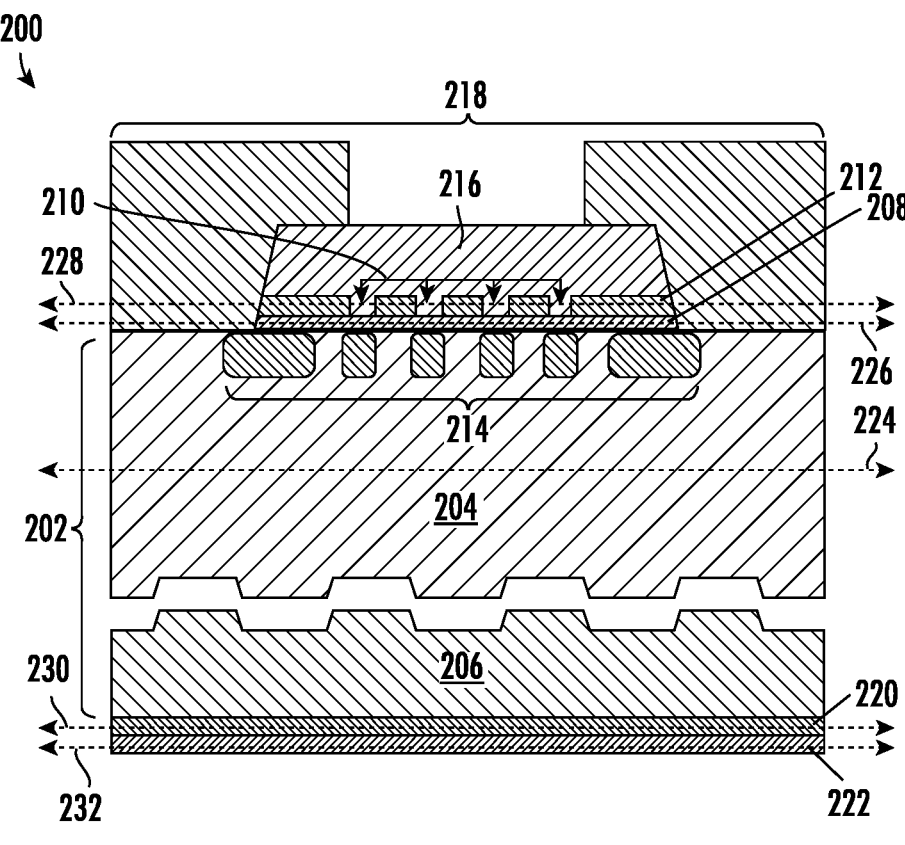
Figure 2B:
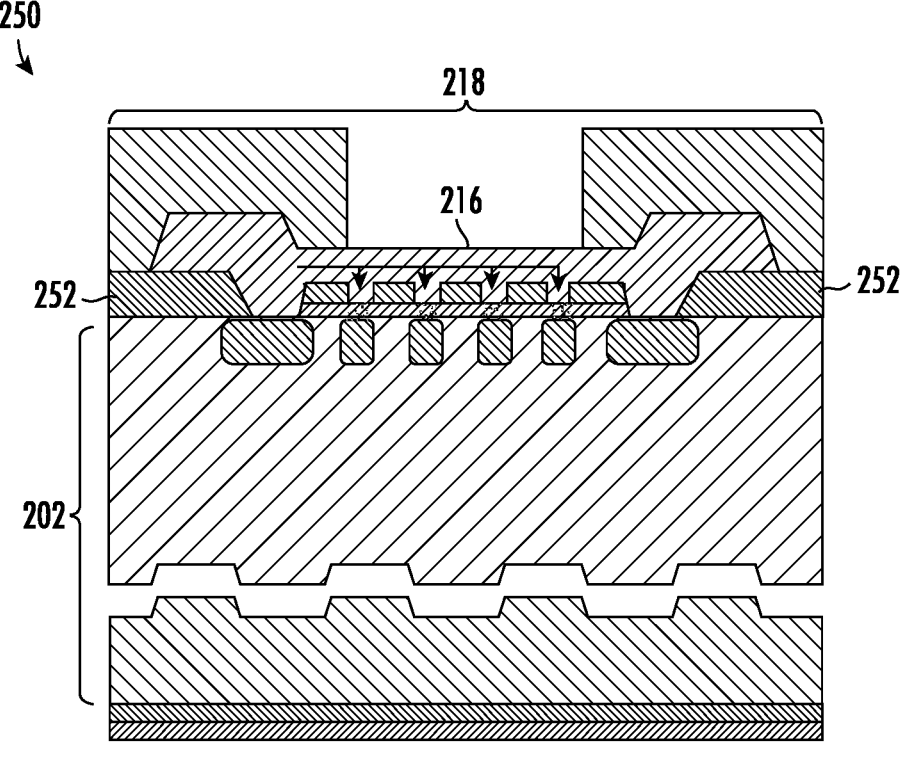
Figure 3A:
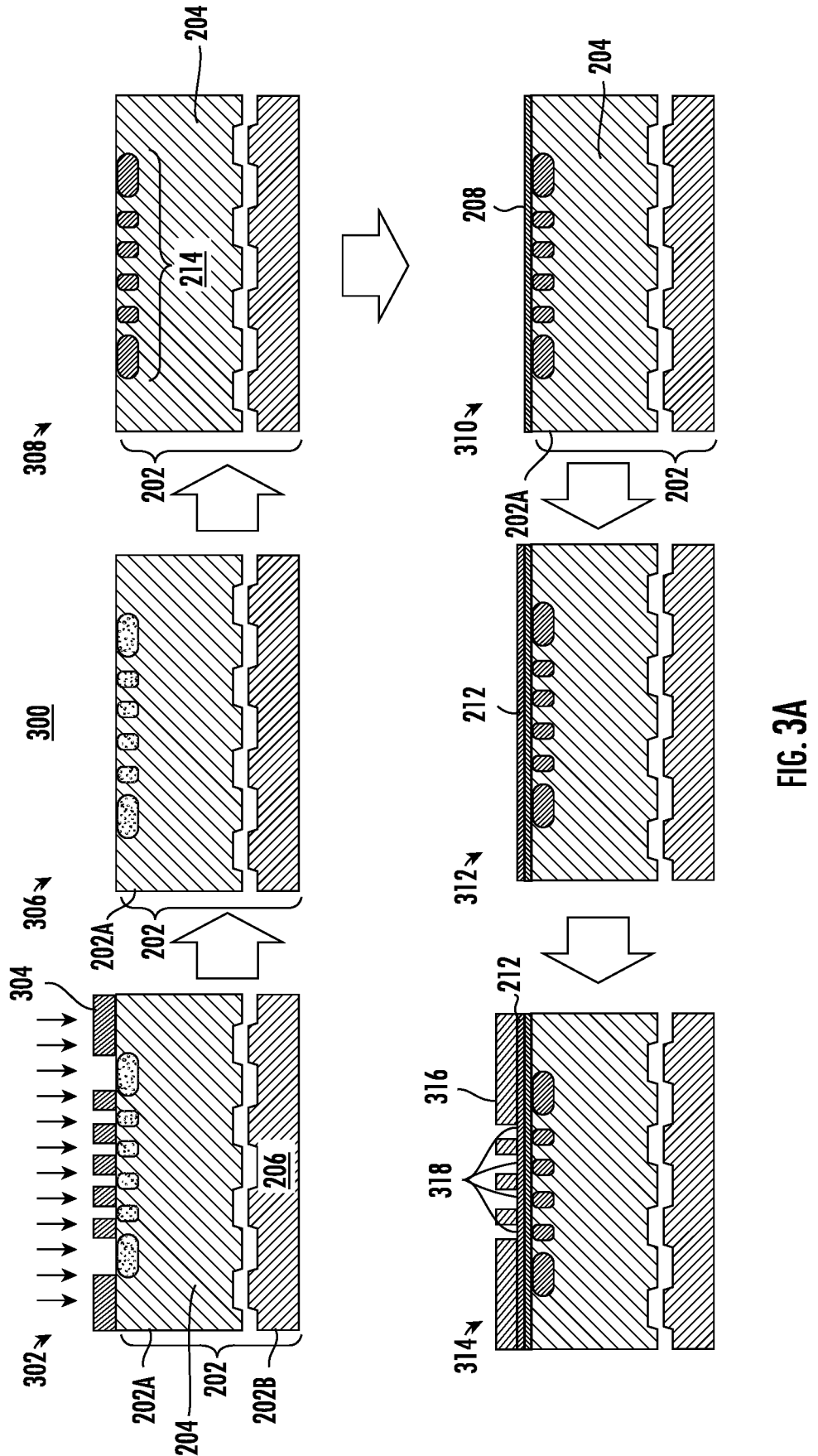
Figure 3B:
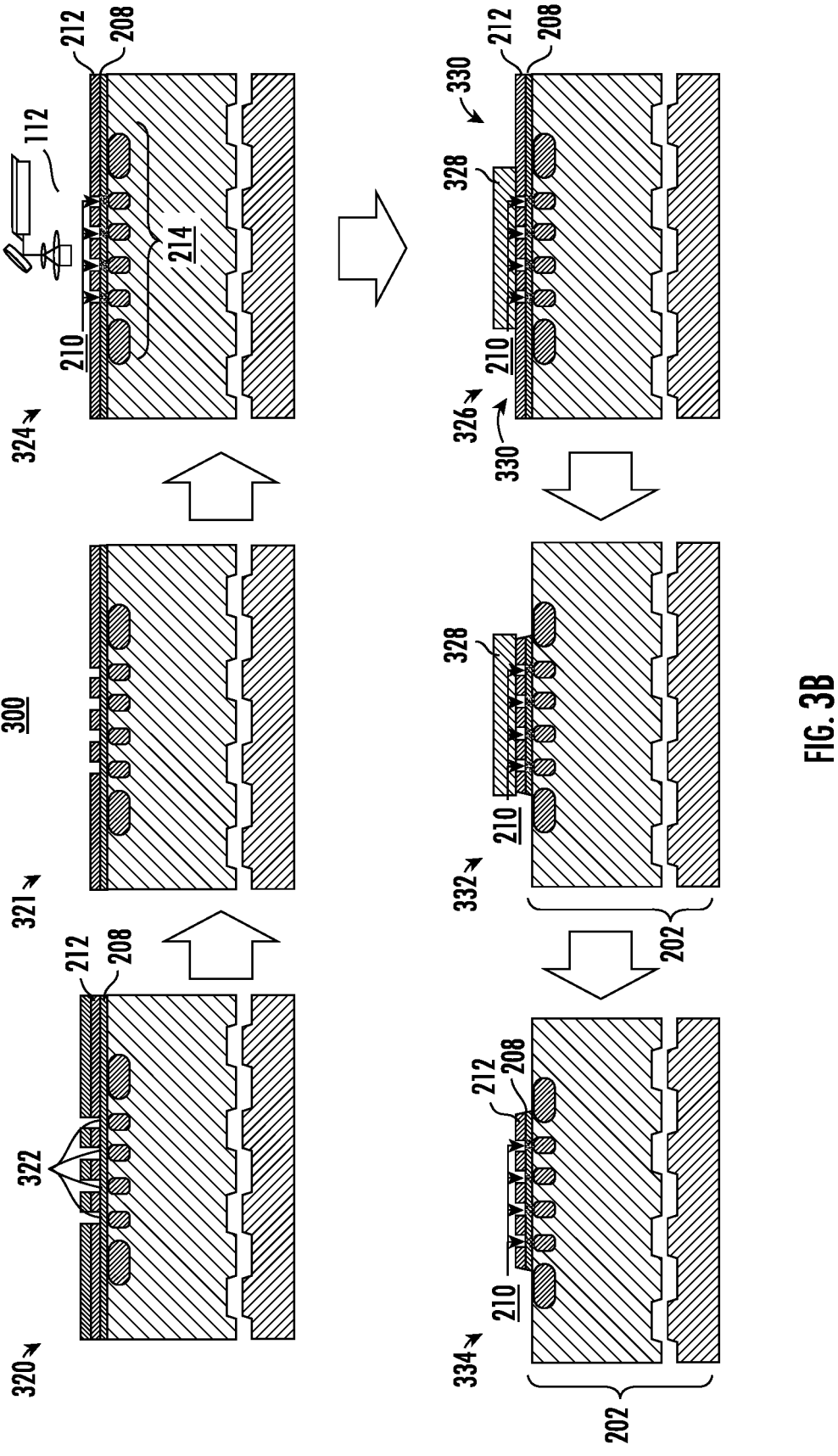
Figure 3C:
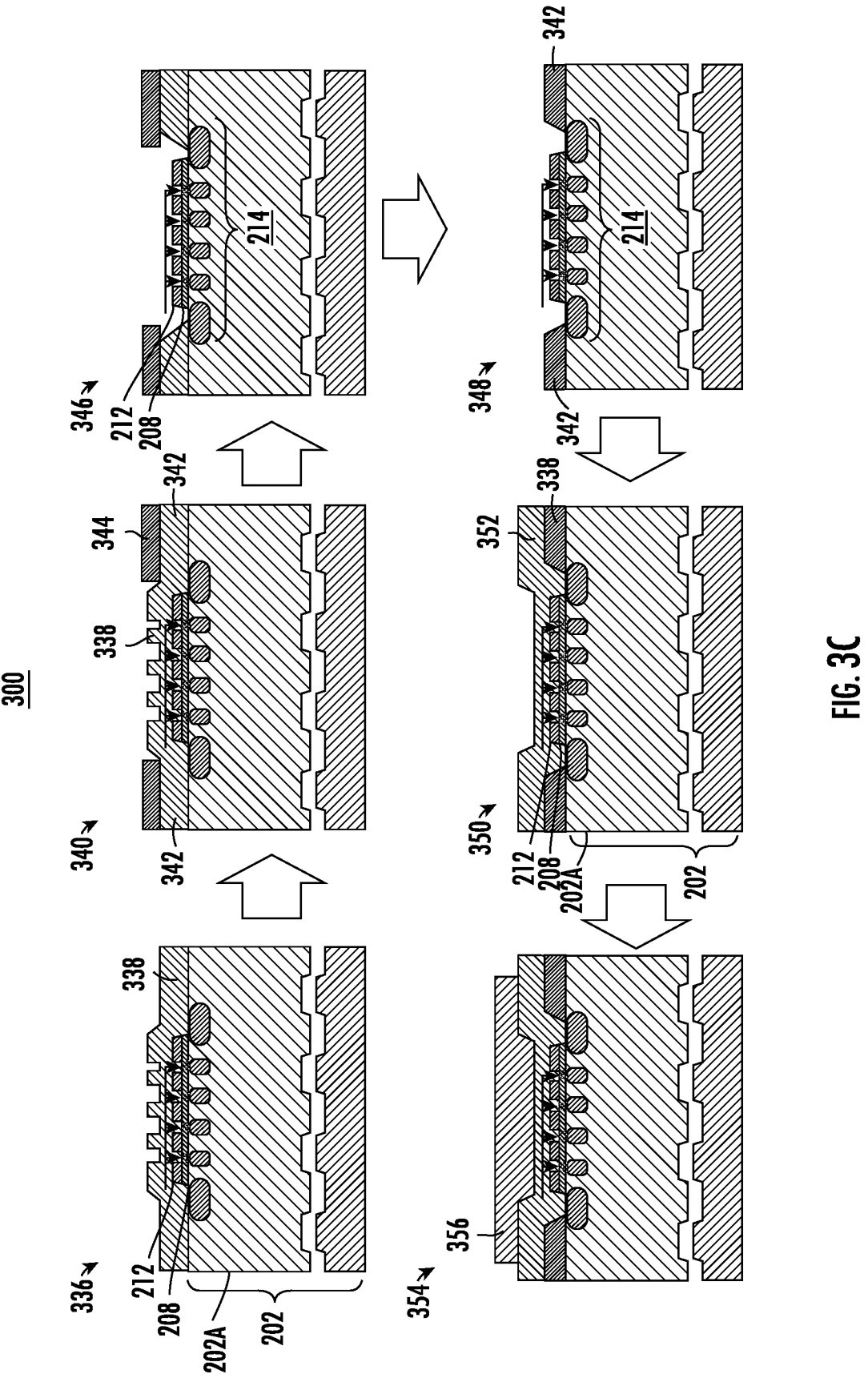
Figure 3D:
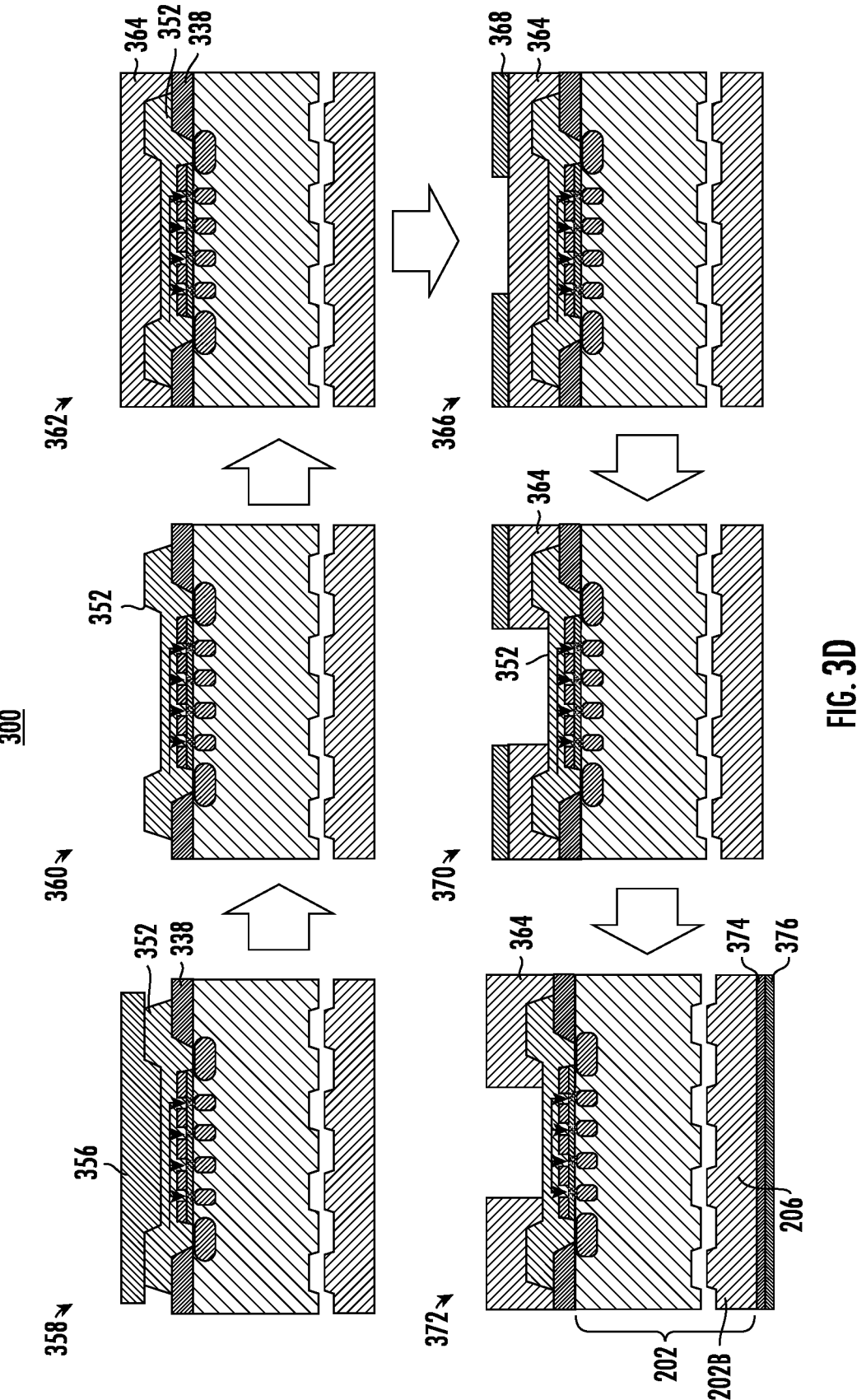
Figure 4:
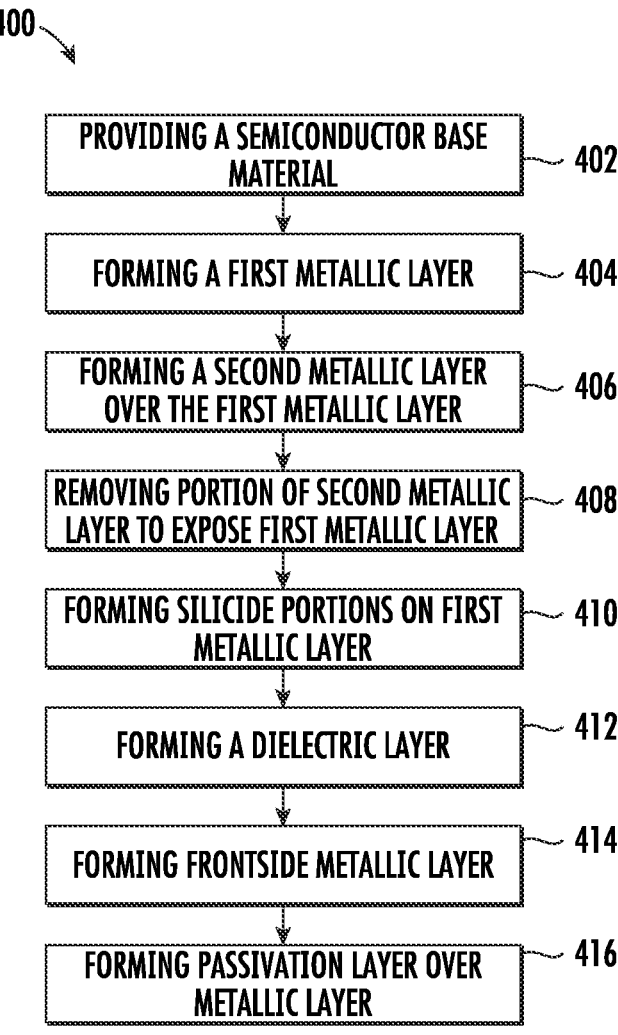

Having thus described certain example embodiments of the present disclosure in general terms, reference will now be made to the accompanying drawings, which are not necessarily drawn to scale, and wherein:

FIG. 1 illustrates an example computing entity in accordance with one or more embodiments of the present disclosure;

FIGS. 2A-B illustrate example SiC power devices in accordance with one or more embodiments of the present disclosure;

FIGS. 3A-D illustrate example stages for fabricating a SiC device in accordance with one or more embodiments of the present disclosure; and FIG. 4 illustrates a flowchart of an example method for fabricating a SiC device in accordance with one or more embodiments of the present disclosure.

DETAILED DESCRIPTION

Embodiments of the present disclosure will now be described more fully herein with reference to the accompanying drawings, in which some, but not all, embodiments of the disclosure are shown. Indeed, various embodiments of the disclosure may be embodied in many different forms and should not be construed as limited to the embodiments set forth herein; rather, these embodiments are provided so that this disclosure will satisfy applicable legal requirements. Like reference numerals refer to like elements throughout.

Various example embodiments of the present disclosure are directed to improved SiC devices and systems, apparatuses, products, and methods for fabricating improved SiC devices. The present disclosure, in some examples, describes a method for the realization of front side ohmic contacts for SiC Merged PiN Schottky (MPS) devices, among other SiC devices, that improve upon traditional techniques for fabricating SiC devices.

Traditionally, complex process flows are needed to realize ohmic contact formations on p+ and/or n+ regions of SiC devices. An ohmic contact formation may require a (i) metal deposition, such as a nickel or other conductive material, (ii) an annealing temperature at near 1000° C. to trigger a reaction between the metal deposition and the SiC (e.g., to form of silicides, titanium silicides, etc.), and (iii) the removal of portions of the metal deposition that are in direct contact with the SiC surface. The selective removal of portions of the metal deposition may be complex and, in part due to the complexity, is unreliable and prone to errors, while being critical to the functionality of SiC devices. Thus, traditional techniques for fabricating SiC devices face technical challenges that decrease their reliability, while increasing the rate of failure as well as the cost and expense of fabrication.

To address these technical challenges, some embodiments of the present disclosure provide an improved SiC formation that includes a single layer of metal to realize both a Schottky contact and ohmic contact. The Schottky contact and the Ohmic contact may be realized through a laser annealing process by shielding the single layer of metal by a patterned second metal layer. Each layer may not be sacrificial and may be part of an active area of the SiC device; thereby, reducing the risk of damaging the SiC device by removing metal layers in direct contact with a SiC surface. In some embodiments of the present disclosure the techniques include providing a semiconductor base material with a first side and a second side, forming a first metallic layer on a first side of the semiconductor base material to form a Schottky contact, forming a second metallic layer over the first metallic layer to form a reflective barrier layer covering the Schottky contact, removing one or more portions of the second metallic layer to expose a first portion of the first metallic layer; and forming, through a laser annealing process, one or more silicide portions (e.g., titanium silicides, etc.) on the first metallic layer to form one or more ohmic contacts within the Schottky contact. By doing so, example techniques of the present disclosure address technical challenges related to SiC devices by eliminating the need to remove a metal deposition in direct contact with the SiC surface. In this way, various embodiments of the present disclosure prevent damage to SiC devices during fabrication, while reducing fabrication costs, efficiency, and reliability.

It should be readily appreciated that the embodiments of the systems, apparatus, and methods described herein may be configured in various additional and alternative manners in addition to those expressly described herein.

FIG. 1 illustrates an example computing system 100 in accordance with one or more embodiments of the present disclosure. In general, the terms computing system, computer, system, device, entity, and/or similar words used herein interchangeably may refer to, for example, one or more computers, computing entities, desktops, mobile phones, tablets, notebooks, laptops, distributed systems, kiosks, input terminals, servers or server networks, blades, gateways, switches, processing devices, processing entities, set-top boxes, relays, routers, network access points, base stations, the like, and/or any combination of devices or entities adapted to perform the functions, operations, and/or processes described herein. Such functions, operations, and/or processes may include, for example, transmitting, receiving, operating on, processing, displaying, storing, determining, creating/generating, monitoring, evaluating, comparing, and/or similar terms used herein interchangeably. In one embodiment, these functions, operations, and/or processes may be performed on data, content, information, and/or similar terms used herein interchangeably.

The computing system 100 may include a computing apparatus 110 and/or one or more computing entities 120 communicatively coupled to the computing apparatus 110 using one or more wired and/or wireless communication techniques. The computing apparatus 110 may include any computing device including, for example, one or more services, computing platforms, and/or the like, that are specially configured to perform one or more steps/operations of the one or more fabrication techniques described herein. In some embodiments, the computing apparatus 110 may include and/or be in association with one or more mobile device(s), desktop computer(s), laptop(s), server(s), cloud computing platform(s), and/or the like. In some example embodiments, the computing apparatus 110 may be configured to receive and/or provide power conversion instructions, data, and/or the like between the one or more computing entities 120 to perform one or more steps/operations of one or more fabrication techniques described herein.

In some embodiments, the computing apparatus 110 includes, is integrated with, and/or is otherwise in association with one or more computing entities 120. The one or more computing entities 120 may include one or more semiconductor fabrication devices, such as one or more reactive etching devices 114 (e.g., ion-etching device, chemical etching devices, physical etching devices, etc.), one or more laser annealing machines 112 (e.g., ultraviolet lasers, fiber lasers, carbon dioxide lasers, etc.), chemical, physical, atomic, and/or the like deposition devices (e.g., plasma-enhanced chemical vapor deposition (PECVD), sputter vapor deposition, thermal evaporation, arc vapor deposition, etc.). For example, the computing apparatus 110 may be configured to receive and/or provide one or more fabrication instructions between one or more components of the one or more computing entities 120. The computing entities 120, for example, may include and/or be associated with one or more fabrication systems configured to perform one or more fabrication operations for fabricating SiC, and/or other power devices. The one or more fabrication systems, for example, may be configured to fabricate one or more SiC power devices (e.g., MOSFETs, Diodes, IGBTs, etc.) for use with one or more converters, inverters, power supplies, battery chargers, motor control systems, and/or the like.

The computing apparatus 110 may include, or be in communication with, one or more processing elements 102 (also referred to as processors, processing circuitry, digital circuitry, and/or similar terms used herein interchangeably) that communicate with other elements within the computing apparatus 110 via a bus, for example. As will be understood, the processing element 102 may be embodied in a number of different ways.

For example, the processing element 102 may be embodied as one or more complex programmable logic devices (CPLDs), microprocessors, multi-core processors, coprocessing entities, application-specific instruction-set processors (ASIPs), microcontrollers, and/or controllers. Further, the processing element 102 may be embodied as one or more other processing devices or circuitry. The term circuitry may refer to an entirely hardware embodiment or a combination of hardware and computer program products. Thus, the processing element 102 may be embodied as integrated circuits, application specific integrated circuits (ASICs), field programmable gate arrays (FPGAs), programmable logic arrays (PLAs), hardware accelerators, digital circuitry, and/or the like.

As will therefore be understood, the processing element 102 may be configured for a particular use or configured to execute instructions stored in volatile or non-volatile media or otherwise accessible to the processing element 102. As such, whether configured by hardware or computer program products, or by a combination thereof, the processing element 102 may be capable of performing steps or operations according to embodiments of the present disclosure when configured accordingly.

In one embodiment, the computing apparatus 110 may further include, or be in communication with, one or more memory elements 104. The one or more memory elements 104 may include non-volatile and/or volatile media. The memory elements 104, for example, may include non-volatile media (also referred to as non-volatile storage, memory, memory storage, memory circuitry and/or similar terms used herein interchangeably). In one embodiment, the non-volatile storage or memory may include one or more non-volatile storage or memory media, including, but not limited to, hard disks, ROM, PROM, EPROM, EEPROM, flash memory, MMCs, SD memory cards, Memory Sticks, CBRAM, PRAM, FeRAM, NVRAM, MRAM, RRAM, SONOS, FJG RAM, Millipede memory, racetrack memory, and/or the like.

As will be recognized, the non-volatile storage or memory media may store databases, database instances, database management systems, data, applications, programs, program modules, scripts, source code, object code, byte code, compiled code, interpreted code, machine code, executable instructions, and/or the like. The term database, database instance, database management system, and/or similar terms used herein interchangeably may refer to a collection of records or data that is stored in a computer-readable storage medium using one or more database models, such as a hierarchical database model, network model, relational model, entity-relationship model, object model, document model, semantic model, graph model, and/or the like.

In addition, or alternatively, the memory elements 104 may include volatile memory. For example, the computing apparatus 110 may further include, or be in communication with, volatile media (also referred to as volatile storage memory, memory storage, memory circuitry and/or similar terms used herein interchangeably). In one embodiment, the volatile storage or memory may also include one or more volatile storage or memory media, including, but not limited to, RAM, DRAM, SRAM, FPM DRAM, EDO DRAM, SDRAM, DDR SDRAM, DDR2 SDRAM, DDR3 SDRAM, RDRAM, TTRAM, T-RAM, Z-RAM, RIMM, DIMM, SIMM, VRAM, cache memory, register memory, and/or the like.

As will be recognized, the volatile storage or memory media may be used to store at least portions of the databases, database instances, database management systems, data, applications, programs, program modules, scripts, source code, object code, byte code, compiled code, interpreted code, machine code, executable instructions, and/or the like being executed by, for example, the processing element 102. Thus, the databases, database instances, database management systems, data, applications, programs, program modules, scripts, source code, object code, byte code, compiled code, interpreted code, machine code, executable instructions, and/or the like may be used to control certain aspects of the operation of the computing apparatus 110 with the assistance of the processing element 102 and operating system.

As indicated, in one embodiment, the computing apparatus 110 may also include one or more communication interfaces 108 for communicating with various computing entities, including computing entities 120, such as by communicating data, content, information, and/or similar terms used herein interchangeably that may be transmitted, received, operated on, processed, displayed, stored, and/or the like. The one or more communication interfaces 108, for example, may include one or more wired peripherals (e.g., fiber interfaces, ethernet ports, and/or the like), antenna, transmitters, receivers, digital to analog converters (DAC), analog to digital converters (ADC), modulators, demodulators, and/or the like. Such communication may be executed using a wired data transmission protocol, such as fiber distributed data interface (FDDI), digital subscriber line (DSL), Ethernet, asynchronous transfer mode (ATM), frame relay, data over cable service interface specification (DOCSIS), or any other wired transmission protocol. Similarly, the computing apparatus 110 may be configured to communicate via wireless external communication networks using any of a variety of protocols, such as general packet radio service (GPRS), Universal Mobile Telecommunications System (UMTS), Code Division Multiple Access 2000 (CDMA2000), CDMA2000 1× (1×RTT), Wideband Code Division Multiple Access (WCDMA), Global System for Mobile Communications (GSM), Enhanced Data rates for GSM Evolution (EDGE), Time Division-Synchronous Code Division Multiple Access (TD-SCDMA), Long Term Evolution (LTE), Evolved Universal Terrestrial Radio Access Network (E-UTRAN), Evolution-Data Optimized (EVDO), High Speed Packet Access (HSPA), High-Speed Downlink Packet Access (HSDPA), IEEE 802.9 (Wi-Fi), Wi-Fi Direct, 802.16 (WiMAX), ultra-wideband (UWB), infrared (IR) protocols, NFC protocols such as NFC-A, NFC-B, NFC-F, Wibree, Bluetooth protocols, wireless universal serial bus (USB) protocols, and/or any other wireless protocol.

The computing apparatus 110 may include input/output circuitry for communicating with one or more users. The input/output circuitry, for example, may include one or more user interfaces for providing and/or receiving information from one or more users of the computing apparatus 110. The input/output interfaces may include one or more tactile interfaces (e.g., keypads, touch screens, etc.), one or more audio interfaces (e.g., microphones, speakers, etc.), visual interfaces (e.g., display devices, etc.), and/or the like. The input/output circuitry may be configured to receive user input through one or more of the user interfaces from a user of computing apparatus 110 and provide data to a user through one or more of the user interfaces.

Example embodiments of the present disclosure describe an improved SiC power device structure that may be fabricated using improved fabrication techniques. The improved fabrication techniques eliminate the need to remove metallic material in contact with a SiC surface, which reduces fabrication complexity and risk of damage among other benefits described herein.

FIG. 2A illustrates an example SiC power device 200 in accordance with one or more embodiments of the present disclosure. The SiC power device 200 may be fabricated using one or more of the improved fabrication techniques of the present disclosure. The SiC power device 200, or SiC power device 200, may include a semiconductor device with a plurality of material layers.

In some embodiments, the SiC power device 200 includes a semiconductor base material 202. The semiconductor base material 202 may include a SiC material. The SiC material may extend in lateral directions along a base plane 224. In some examples, the SiC material may include a wide bandgap semiconductor material. The semiconductor base material 202 may include a first side and a second side. The first side may include an epitaxial drift layer 204. The second side may include a doped SiC substrate 206. The doped SiC substrate 206, for example, may be doped with one or more combinations of aluminum, boron, gallium, and/or the like to fabricate a P-type SiC power device. In addition, or alternatively, the doped SiC substrate 206 may be doped with one or more combinations of nitrogen, phosphorus, and/or the like to fabricate an N-type SiC power device.

In some embodiments, the semiconductor base material 202 includes one or more anode implants 214. The anode implants 214 may be disposed within the epitaxial drift layer 204. In some examples, the anode implants 214 may extend vertically from a surface of the epitaxial drift layer 204 toward the base plane 224. In some examples, the anode implants may include an epitaxially grown guard ring.

In some embodiments, the SiC power device 200 includes a first metallic layer 208 and/or a second metallic layer 212. The first metallic layer 208 may be disposed on the first side of the semiconductor base material 202. For example, the first metallic layer 208 may be disposed on the surface of the epitaxial drift layer 204. The first metallic layer 208 may be disposed directly on the surface of the epitaxial drift layer 204. In some examples, the first metallic layer 208 may cover the anode implants. The first metallic layer 208, for example, may extend laterally along a surface plane 226 of the epitaxial drift layer 204. The first metallic layer may include an electrically and/or thermally conductive metal, such as nickel material (chemical symbol Ni), gold (chemical symbol Au), germanium (chemical symbol Ge), tin (chemical symbol Sn), indium tin oxide, titanium (chemical symbol Ti), molybdenum (chemical symbol Mo), tungsten (chemical symbol W), titanium nitride (chemical symbol TiN), molybdenum nitride (chemical symbol MoN), tungsten nitride (chemical symbol WN), and/or the like.

In some embodiments, the first metallic layer 208 forms one or more ohmic contacts 210 and/or a Schottky contact for the SiC power device 200. For instance, the single, first metallic layer 208 may form both the ohmic contacts 210 and the Schottky contact. The first metallic layer 208 may form the one or more ohmic contacts 210 and the Schottky contact within a same plane (e.g., the surface plane 226). By way of example, the one or more ohmic contacts 210 and the Schottky contact may be formed within a p+ region of the SiC device (e.g., to prevent short circuit behavior during biasing, etc.).

For example, a first portion of the first metallic layer 208 may form the one or more ohmic contacts 210 and/or a second portion of the first metallic layer 208 may form the Schottky contact. In some examples, the one or more ohmic contacts may include one or more silicide portions (e.g., titanium silicides, etc.) on the first metallic layer 208. The one or more silicide portions may correspond to the one or more anode implants 214. For example, the silicide portions may be disposed directly over one or more of the anode implants 214.

In some embodiments, the second metallic layer 212 is disposed on the first metallic layer 208. For example, the second metallic layer 212 may be disposed directly on the first metallic layer 208. The second metallic layer 212, for example, may extend laterally along a barrier plane 228 over the first metallic layer 208. In some examples, the second metallic layer 212 may include one or more cutouts that expose one or more portions of the first metallic layer 208. For instance, the second metallic layer 212 may be disposed on a second portion of the first metallic layer 208 and expose a first portion (e.g., the ohmic contacts 210) of the first metallic layer 208. The second metallic layer may include a reflective metal, such as an aluminum material (chemical symbol Al), and/or the like. As described herein, second metallic layer 212 may act as a barrier layer during the fabrication of the SiC power device 200. The second metallic layer 212 may not be sacrificial and may be part of the active area of the SiC power device 200.

In some embodiments, the SiC power device 200 includes a frontside metallic layer 216 and/or a passivation layer 218. The frontside metallic layer 216 may include any type of metal layer including, as examples, aluminum, nickel, chromium, gold, germanium, copper, silver, titanium, tungsten, platinum, tantalum, and/or the like. The frontside metallic layer 216 may be disposed on the first metallic layer 208 and/or the second metallic layer 212. For example, the frontside metallic layer 216 may directly cover the second metallic layer 212 and the exposed portions (e.g., the ohmic contacts 210) of the first metallic layer 208. The passivation layer 218 may include any type of insulating material, such as oxide, nitride, and/or the like. The passivation layer 218 may be disposed on the first side of the semiconductor base material 202. For example, the passivation layer 218 may directly cover exposed surface portions of the epitaxial drift layer 204.

In some embodiments, the SiC power device 200 includes a backside ohmic contact 220 and/or a backside metallic layer 222. The backside ohmic contact 220 may extend laterally along a backside surface plane 230 over the surface of the second side (e.g., doped SiC substrate 206) of the semiconductor base material 202. The backside ohmic contact 220 may include any electrically and/or thermally conductive metal including, as examples, nickel (chemical symbol Ni), gold (chemical symbol Au), germanium (chemical symbol Ge), tin (chemical symbol Sn), indium tin oxide, and/or the like. The backside metallic layer 222 may extend laterally along a second plane 232 over the surface of the backside ohmic contact 220. The backside metallic layer 222 may include any type of metal layer including, as examples, aluminum, nickel, chromium, gold, germanium, copper, silver, titanium, tungsten, platinum, tantalum, and/or the like.

FIG. 2B illustrates another example SiC power device 250 in accordance with one or more embodiments of the present disclosure. The SiC power device 250 may be fabricated using one or more of the improved fabrication techniques of the present disclosure. The SiC power device 250 may include a semiconductor device with a plurality of material layers including some of the metal layers described herein with reference to SiC power device 250. In some examples, the SiC power device 250 may include a SiC power device with a field plate edge termination. For example, the SiC power device 250. For example, in addition to the metal, SiC, and/or passivation layers of the SiC power device 200, the SiC power device 250 may include one or more dielectric layers 252. The dielectric layers 252 may cover one or more peripheral portions of the semiconductor base material 202. For example, the dielectric layers 252 may separate the semiconductor base material 202 from the passivation layer 218 and the frontside metallic layer 216.

The SiC power devices 200 and 250 may be fabricated using improved semiconductor fabrication techniques. Some improved fabrication techniques will be described in further detail with reference to FIGS. 3A-D.

FIG. 3A illustrates an example first stage of a fabrication process 300 for fabricating a SiC device in accordance with one or more embodiments of the present disclosure. The first stage may include a first fabrication operation 302. During the first fabrication operation 302, a semiconductor base material 202 may be provided. The semiconductor base material 202 may include a first side 202A and a second side 202B. The semiconductor base material 202 may include a SiC material. In some examples, the first side 202A may include an epitaxial drift layer 204 and the second side 202B may include a doped SiC substrate 206. During the first fabrication operation 302, an anode mask 304 may be placed over the first side 202A of the semiconductor base material 202. The anode mask 304 may include a patterned mask with one or more cutouts for one or more anode implants. An anode implantation operation may be applied through the anode mask 304 to form one or more anode implants within the epitaxial drift layer 204 of the semiconductor base material 202.

The first stage may include a second fabrication operation 306. During the second fabrication operation 306, the anode mask 304 may be removed from the surface of the first side 202A of the semiconductor base material 202. The first stage may include a third fabrication operation 308, during which the one or more anode implants 214 may be formed within the first side 202A (e.g., the epitaxial drift layer 204) of the semiconductor base material 202. In some examples, the third fabrication operation 308 may include a dopant activation. The dopant activation may include a high temperature annealing (e.g., ~1600 C, etc.).

The first stage may include a fourth fabrication operation 310. During the fourth fabrication operation 310, a first metallic layer 208 may be formed on a first side 202A of the semiconductor base material 202 to form a Schottky contact. The first metallic layer 208 may be formed using one or more metal deposition techniques, such as one or more laser metal deposition, direct metal deposition, cold spray metal deposition, and/or the like. In some examples, the first metallic layer may include a titanium-based material and/or any other electrically and/or thermally conductive metal (e.g., nickel-based, etc.).

The first stage may include a fifth fabrication operation 312. During the fifth fabrication operation 312, a second metallic layer 212 may be formed over the first metallic layer 208 to form a reflective barrier layer covering the Schottky contact. The second metallic layer 212 may be formed using one or more metal deposition techniques, described herein. In some examples, the second metallic layer may include an aluminum-based material and/or any other reflective metal.

The first stage may include a sixth fabrication operation 314. During the sixth fabrication operation 314, a patterned mask 316 may be placed over the second metallic layer 212. The patterned mask 316 may expose one or more portions 318 of the second metallic layer 212.

Turning to FIG. 3B, FIG. 3B illustrates an example second stage of a fabrication process 300 for fabricating a SiC device in accordance with one or more embodiments of the present disclosure.

The second stage may include a seventh fabrication operation 320. During the seventh fabrication operation 320, the one or more exposed portions of the second metallic layer 212 may be removed to expose a first portion 322 of the first metallic layer 208. In some examples, the one or more exposed portions of the second metallic layer 212 may be etched to expose the first portion 322 of the first metallic layer 208. For example, the second metallic layer 212 may be etched, through the patterned mask 316, to remove the one or more portions of the second metallic layer 212 and expose the first portion 322 of the first metallic layer 208. The second metallic layer 212 may be etched using one or more etching techniques, such as chemical etching, mechanical etching, wet etching, dry etching, and/or the like. The second stage may include an eighth fabrication operation 321, during which the patterned mask 316 may be removed from the second metallic layer 212.

The second stage may include a ninth fabrication operation 324. During the ninth fabrication operation 324, one or more silicide portions (e.g., titanium silicide, etc.) may be formed on the first metallic layer 208 to form one or more ohmic contacts 210 within the Schottky contact. In some examples, the one or more silicide portions may be formed through a laser annealing process. The laser annealing process, for example, may include applying a laser annealing machine 112 to the first metallic layer 208 through the reflective layer of the second metallic layer 212. In this way, the first metallic layer 208 may form the one or more ohmic contacts 210 and/or the Schottky contact within a same plane. In some examples, the one or more silicide portions on the first metallic layer 208 may correspond to the one or more anode implants 214. For example, each silicide portion may align with at least one of the one or more anode implants 214. In this manner, ohmic contacts 210 and/or Schottky contacts may be formed on the p+ region of the SiC device to guarantee the right onset of the PN junction when high current flow is needed.

The second stage may include a tenth fabrication operation 326. During the tenth fabrication operation 326, an interior mask 328 may be placed over the second metallic layer 212. The interior mask 328 may expose one or more peripheral portions 330 of the second metallic layer 212, while covering an interior portion of the second metallic layer 212 and the first metallic layer 208 including the ohmic contacts 210.

The second stage may include an eleventh fabrication operation 332. During the eleventh fabrication operation 332, subsequent to forming the one or more silicide portions on the first metallic layer 208, the one or more peripheral portions 330 of the first metallic layer 208 and the second metallic layer 212 may be removed to expose at least a portion of the semiconductor base material 202. For example, the second metallic layer 212 and/or the first metallic layer 208 may be etched, around the interior mask 328, to remove the one or more peripheral portions 330 of the second metallic layer 212 and/or the first metallic layer 208. The first and second metallic layers may be etched using any etching process, such as those described herein. The second stage may include a twelfth fabrication operation 334, during which the interior mask 328 may be removed to expose the interior portion of the second metallic layer 212 and the first metallic layer 208 including the ohmic contacts 210.

Turning to FIG. 3C, FIG. 3C illustrates an example third stage of a fabrication process 300 for fabricating a SiC device in accordance with one or more embodiments of the present disclosure.

The third stage may include a thirteenth fabrication operation 336. During the thirteenth fabrication operation 336, subsequent to forming the one or more silicide portions on the first metallic layer 208, a dielectric layer 338 may be formed on the first side 202A of the semiconductor base material 202. The dielectric layer 338 may cover the semiconductor base material 202, the first metallic layer 208, and/or the second metallic layer 212.

The third stage may include a fourteenth fabrication operation 340. During the fourteenth fabrication operation 340, a dielectric layer mask 344 may be placed over one or more peripheral dielectric portions 342 of the dielectric layer 338. During a fifteenth fabrication operation 346, an interior dielectric portion may be etched from the dielectric layer 338 to expose the second metallic layer 212 and/or the one or more silicide portions (e.g., ohmic contacts 210) on the first metallic layer 208. During the sixteenth operation 348, the dielectric layer mask 344 may be removed to expose the peripheral dielectric portions 342 of the dielectric layer 338.

The third stage may include a seventeenth fabrication operation 350. During the seventeenth fabrication operation 350, a frontside metallic layer 352 may be formed over the first side 202A of the semiconductor base material 202, the dielectric layer 338, the first metallic layer 208, and/or the second metallic layer 212. The third stage may include an eighteenth fabrication operation 354, during which a frontside metallic layer mask 356 may be placed over an interior portion of the frontside metallic layer 352.

Turning to FIG. 3D, FIG. 3D illustrates an example fourth stage of a fabrication process 300 for fabricating a SiC device in accordance with one or more embodiments of the present disclosure.

The fourth stage may include a nineteenth fabrication operation 358. During the nineteenth fabrication operation 358, a peripheral frontside metallic portion may be removed from the frontside metallic layer 352 to expose the dielectric layer 338. For example, the peripheral frontside metallic portion may be etched, around the frontside metallic layer mask 356, to remove the peripheral frontside metallic portion from the frontside metallic layer 352 and expose the dielectric layer 338. The fourth stage may include a twentieth fabrication operation 360, during which the frontside metallic layer mask 356 may be removed to expose the frontside metallic layer 352.

The fourth stage may include a twenty-first fabrication operation 362. During the twenty-first fabrication operation 362, a passivation layer 364 may be formed over the dielectric layer 338 and the frontside metallic layer 352. By way of example, the passivation layer may include an oxide and/or nitride layer that is formed by performing one or more plasma enhanced chemical vapor deposition and/or any other deposition techniques. The fourth stage may include a twenty-second fabrication operation 366. During the twenty-second fabrication operation 366, a passivation layer mask 368 may be placed over a peripheral portion of the passivation layer 364. The fourth stage may include a twenty-third fabrication operation 370. During the twenty-third fabrication operation 370, an interior passivation layer portion may be removed (e.g., etched, etc.) from the passivation layer 364 to expose the frontside metallic layer 352. The fourth stage may include a twenty-fourth fabrication operation 372. During the twenty-fourth fabrication operation 372, the passivation layer mask 368 may be removed to expose the passivation layer 364. In addition, or alternatively, during the twenty-fourth fabrication operation 372, a backside ohmic contact 374 may be formed on the second side 202B of the semiconductor base material 202. In some examples, the backside metallic layer 376 may be formed over the backside ohmic contact 374.

FIG. 4 illustrates a flowchart of an example method 400 for fabricating a SiC device in accordance with one or more embodiments of the present disclosure. The flowchart depicts techniques for overcoming various limitations of traditional SiC fabrication processes for fabricating SiC power devices. The techniques may be implemented by one or more computing devices, entities, and/or systems described herein. For example, via the various steps/operations of the method 400, a computing device, such as the computing apparatus 110 described herein, may implement the techniques (e.g., via one or more control instructions to one or more computing entities 120) to overcome the various limitations with traditional SiC fabrication processes by maximizing surge peak forward current (IFSM) ruggedness of Merged Pin Schottky Diode in Silicon Carbide, minimizing and simplifying fabrication process flow, avoiding metal scraps due to nickel silicide protrusion and nickel residual, among other advantages.

FIG. 4 illustrates an example method 400 for explanatory purposes. Although the example method 400 depicts a particular sequence of steps/operations, the sequence may be altered without departing from the scope of the present disclosure. For example, some of the steps/operations depicted may be performed in parallel or in a different sequence that does not materially impact the function of the method 400. In other examples, different components of an example device or system that implements the method 400 may perform functions at substantially the same time or in a specific sequence.

According to some examples, the method 400 includes, at step/operation 402, providing a semiconductor base material. For example, the method 400 may include providing a semiconductor base material that includes a first side and a second side. The semiconductor base material may include a silicon carbide material.

According to some examples, the method 400 includes, at step/operation 404, forming a first metallic layer. For example, the method 400 may include forming a first metallic layer on a first side of the semiconductor base material to form a Schottky contact.

According to some examples, the method 400 includes, at step/operation 406, forming a second metallic layer over the first metallic layer. For example, the method 400 may include forming a second metallic layer over the first metallic layer to form a reflective barrier layer covering the Schottky contact.

According to some examples, the method 400 includes, at step/operation 408, removing a portion of the second metallic layer to expose the first metallic layer. For example, the method 400 may include removing one or more portions of the second metallic layer to expose a first portion of the first metallic layer. In some examples, the method 400 may include placing a patterned mask over the second metallic layer. The patterned mask may expose the one or more portions of the second metallic layer. The method 400 may include etching the second metallic layer, through the patterned mask, to remove the one or more portions of the second metallic layer and then removing the patterned mask.

According to some examples, the method 400 includes, at step/operation 410, applying a laser annealing process to form silicide portions on the first metallic layer. For example, the method 400 may include forming, through a laser annealing process, one or more silicide portions on the first metallic layer to form one or more ohmic contacts within the Schottky contact. In some examples, the first metallic layer forms the one or more ohmic contacts and the Schottky contact within a same plane. For example, the one or more ohmic contacts and the Schottky contact may be formed in a p+ region of the SiC device to prevent short circuit behavior during biasing.

In some embodiment, subsequent to forming the one or more silicide portions on the first metallic layer, the method 400 may include removing one or more peripheral portions of the first metallic layer and the second metallic layer to expose at least a portion of the semiconductor base material. In some examples, the method 400 may include placing an interior mask over the second metallic layer. The interior mask may expose the one or more peripheral portions of the second metallic layer. The method 400 may include etching the second metallic layer and the first metallic layer, around the interior mask, to remove the one or more peripheral portions of the second metallic layer and the first metallic layer and then removing the interior mask.

According to some examples, the method 400 includes, at step/operation 412, forming a dielectric layer. For example, the method 400 may include, subsequent to forming the one or more silicide portions on the first metallic layer, forming the dielectric layer on the first side of the semiconductor base material. The dielectric layer may cover the semiconductor base material, the first metallic layer, and the second metallic layer. In some examples, the method 400 may include placing a dielectric layer mask over one or more peripheral dielectric portions of the dielectric layer. The method may include etching an interior dielectric portion from the dielectric layer to expose the second metallic layer and the one or more silicide portions on the first metallic layer and then removing the dielectric layer mask.

According to some examples, the method 400 includes, at step/operation 414, forming a frontside metallic layer. For example, the method 400 may include forming a frontside metallic layer over the first side of the semiconductor base material, the dielectric layer, the first metallic layer, and the second metallic layer. In some examples, the method 400 may include placing a frontside metallic layer mask over an interior portion of the frontside metallic layer. The method 400 may include etching a peripheral frontside metallic portion from the frontside metallic layer to expose the dielectric layer and removing the frontside metallic layer mask.

According to some examples, the method 400 includes, at step/operation 416, forming a passivation layer. For example, the method 400 may include forming a passivation layer over the dielectric layer and the frontside metallic layer. In some examples, the method 400 may include placing a passivation layer mask over a peripheral portion of the passivation layer. The method 400 may include etching an interior passivation layer portion from the passivation layer to expose the frontside metallic layer and then removing the passivation layer mask.

In some examples, the method 400 may include forming a backside ohmic contact on the second side of the semiconductor base material and then forming a backside metallic layer over the backside ohmic contact.

CONCLUSION

Many modifications and other embodiments of the disclosures set forth herein will come to mind to one skilled in the art to which these disclosures pertain having the benefit of teachings presented in the foregoing descriptions and the associated drawings. Although the figures only show certain components of the apparatus and systems described herein, it is understood that various other components may be used in conjunction with the system. Therefore, it is to be understood that the disclosures are not to be limited to the specific embodiments disclosed and that modifications and other embodiments are intended to be included within the scope of the appended claims. Moreover, the steps in the method described above may not necessarily occur in the order depicted in the accompanying diagrams, and in some cases one or more of the steps depicted may occur substantially simultaneously, or additional steps may be involved. Although specific terms are employed herein, they are used in a generic and descriptive sense only and not for purposes of limitation.

While various embodiments in accordance with the principles disclosed herein have been shown and described above, modifications thereof may be made by one skilled in the art without departing from the spirit and the teachings of the disclosure. The embodiments described herein are representative only and are not intended to be limiting. Many variations, combinations, and modifications are possible and are within the scope of the disclosure. The disclosed embodiments relate primarily to SiC power devices and techniques for fabricating SiC power devices, however, one skilled in the art may recognize that such principles may be applied to any semiconductor device. Alternative embodiments that result from combining, integrating, and/or omitting features of the embodiment(s) are also within the scope of the disclosure. Accordingly, the scope of protection is not limited by the description set out above.

Additionally, the section headings used herein are provided for consistency with the suggestions under 37 C.F.R. 1.77 or to otherwise provide organizational cues. These headings shall not limit or characterize the disclosure(s) set out in any claims that may issue from this disclosure.

Use of broader terms such as "comprises," "includes," and "having" should be understood to provide support for narrower terms such as "consisting of," "consisting essentially of," and "comprised substantially of" Use of the terms "optionally," "may," "might," "possibly," and the like with respect to any element of an embodiment means that the element is not required, or alternatively, the element is required, both alternatives being within the scope of the embodiment(s). Also, references to examples are merely provided for illustrative purposes, and are not intended to be exclusive.

While this detailed description has set forth some embodiments of the present disclosure, the appended claims cover other embodiments of the present disclosure which differ from the described embodiments according to various modifications and improvements. For example, the appended claims may cover any form of semiconductor fabrication.

Within the appended claims, unless the specific term "means for" or "step for" is used within a given claim, it is not intended that the claim be interpreted under 35 U.S.C. 112, paragraph 6.

The invention claimed is:

1. A method comprising:

providing a semiconductor base material comprising a first side and a second side, wherein the semiconductor base material comprises a silicon carbide (SiC) material;

forming a first metallic layer on the first side of the semiconductor base material to form a Schottky contact;

forming a second metallic layer over the first metallic layer to form a reflective barrier layer covering the Schottky contact;

removing one or more portions of the second metallic layer to expose a first portion of the first metallic layer; and forming, through a laser annealing process, one or more silicide portions on the first metallic layer to form one or more ohmic contacts within the Schottky contact.

2. The method of claim 1, wherein the first metallic layer forms the one or more ohmic contacts and the Schottky contact within a p+ region.

3. The method of claim 1 further comprising, subsequent to forming the one or more silicide portions on the first metallic layer, forming a dielectric layer on the first side of the semiconductor base material, wherein the dielectric layer covers the semiconductor base material, the first metallic layer, and the second metallic layer.

4. The method of claim 3 further comprising:

placing a dielectric layer mask over one or more peripheral dielectric portions of the dielectric layer;

etching an interior dielectric portion from the dielectric layer to expose the second metallic layer and the one or more silicide portions on the first metallic layer; and removing the dielectric layer mask.

5. The method of claim 4 further comprising:

forming a frontside metallic layer over the first side of the semiconductor base material, the dielectric layer, the first metallic layer, and the second metallic layer;

placing a frontside metallic layer mask over an interior portion of the frontside metallic layer;

etching a peripheral frontside metallic portion from the frontside metallic layer to expose the dielectric layer; and removing the frontside metallic layer mask.

6. The method of claim 5 further comprising:

forming a passivation layer over the dielectric layer and the frontside metallic layer;

placing a passivation layer mask over a peripheral portion of the passivation layer;

etching an interior passivation layer portion from the passivation layer to expose the frontside metallic layer; and removing the passivation layer mask.

7. The method of claim 1, wherein removing the one or more portions of the second metallic layer comprises:

placing a patterned mask over the second metallic layer, wherein the patterned mask exposes the one or more portions of the second metallic layer;

etching the second metallic layer, through the patterned mask, to remove the one or more portions of the second metallic layer; and removing the patterned mask.

8. The method of claim 1 further comprising, subsequent to forming the one or more silicide portions on the first metallic layer, removing one or more peripheral portions of the first metallic layer and the second metallic layer to expose at least a portion of the semiconductor base material.

9. The method of claim 8 wherein removing the one or more peripheral portions of the first metallic layer comprises:

placing an interior mask over the second metallic layer, wherein the interior mask exposes the one or more peripheral portions of the second metallic layer;

etching the second metallic layer and the first metallic layer, around the interior mask, to remove the one or more peripheral portions of the second metallic layer and the first metallic layer; and removing the interior mask.

10. The method of claim 1 wherein the semiconductor base material comprises one or more anode implants and the one or more silicide portions on the first metallic layer correspond to the one or more anode implants.

11. The method of claim 10 further comprising forming the one or more anode implants within the first side of the semiconductor base material.

12. The method of claim 1, wherein the first side of the semiconductor base material comprises an epitaxial drift layer and the second side of the semiconductor base material comprises a doped SiC substrate.

13. The method of claim 12 further comprising:

forming a backside ohmic contact on the second side of the semiconductor base material; and forming a backside metallic layer over the backside ohmic contact.

14. The method of claim 1, wherein the first metallic layer comprises a nickel-based material.

15. The method of claim 1, wherein the second metallic layer comprises an aluminum-based material.

* * * * *